(12) United States Patent
Ying et al.

(10) Patent No.: US 6,984,585 B2
(45) Date of Patent: Jan. 10, 2006

(54) METHOD FOR REMOVAL OF RESIDUE FROM A MAGNETO-RESISTIVE RANDOM ACCESS MEMORY (MRAM) FILM STACK USING A SACRIFICIAL MASK LAYER

(76) Inventors: Chentsau Ying, 10370 N. Blaney Ave., Cupertino, CA (US) 95014; Xiaoyi Chen, 811 Volans La., Foster City, CA (US) 94404; Padmapani C. Nallan, 2200 Pettigrew Dr., San Jose, CA (US) 95148; Ajay Kumar, 510 Kenilworth Ct., Sunnyvale, CA (US) 94087

( * ) Notice: Subject to any disclaimer, the term of this patent is extended or adjusted under 35 U.S.C. 154(b) by 152 days.

(21) Appl. No.: 10/218,473

(22) Filed: Aug. 12, 2002

(65) Prior Publication Data
US 2004/0029393 A1 Feb. 12, 2004

(51) Int. Cl.
*H01L 21/302* (2006.01)

(52) U.S. Cl. .................................. 438/689; 438/754
(58) Field of Classification Search ................. 438/689, 438/745, 753, 754, 756, 757
See application file for complete search history.

(56) References Cited

U.S. PATENT DOCUMENTS

| | | | |
|---|---|---|---|
| 5,397,742 A * | 3/1995 | Kim ........................ 438/630 |
| 5,496,759 A | 3/1996 | Yue et al. ..................... 437/52 |
| 5,607,599 A | 3/1997 | Ichihara et al. ............... 216/22 |
| 5,732,016 A | 3/1998 | Chen et al. .................. 365/158 |
| 5,871,885 A * | 2/1999 | Roh .......................... 430/313 |
| 5,920,500 A | 7/1999 | Tehrani et al. .............. 365/173 |
| 5,940,319 A | 8/1999 | Durlam et al. .............. 365/171 |
| 6,024,885 A | 2/2000 | Pendharkar et al. .......... 216/22 |
| 6,048,739 A | 4/2000 | Hurst et al. .................... 438/3 |
| 6,153,443 A | 11/2000 | Durlam et al. ................. 438/3 |
| 6,162,738 A * | 12/2000 | Chen et al. ................. 438/745 |
| 6,165,803 A | 12/2000 | Chen et al. .................... 438/3 |
| 6,174,737 B1 | 1/2001 | Durlam et al. ................. 438/3 |
| 6,325,676 B1 * | 12/2001 | Jung et al. .................. 439/719 |
| 6,365,419 B1 | 4/2002 | Durlam et al. ................. 438/3 |
| 6,465,358 B1 * | 10/2002 | Nashner et al. ............. 438/700 |
| 6,485,989 B1 * | 11/2002 | Signorini ....................... 438/3 |
| 6,573,167 B2 * | 6/2003 | Xing et al. ................. 438/552 |
| 2003/0180968 A1 * | 9/2003 | Nallan et al. .................. 438/3 |

* cited by examiner

*Primary Examiner*—Kin-Chan Chen
(74) *Attorney, Agent, or Firm*—Moser, Patterson & Sheridan, LLP; Joseph Bach

(57) ABSTRACT

A method for removal of residues after plasma etching a film stack comprising a first layer and a sacrificial layer. The method treats a substrate containing the film stack after the first layer of the film stack has been etched to remove residue produced during the etching process. The treatment is performed in a buffered oxide etch wet dip solution that removes the residue and the sacrificial layer.

26 Claims, 6 Drawing Sheets

US 6,984,585 B2

METHOD FOR REMOVAL OF RESIDUE FROM A MAGNETO-RESISTIVE RANDOM ACCESS MEMORY (MRAM) FILM STACK USING A SACRIFICIAL MASK LAYER

BACKGROUND OF THE INVENTION

1. Field of the Invention

The present invention generally relates to a method for processing magneto-resistive random access memory (MRAM) film stacks. More specifically, the invention relates to a method for removal of residues after plasma etching a magneto-resistive random access memory (MRAM) film stack using a sacrificial silicon dioxide layer.

2. Description of the Related Art

Microelectronic devices are generally fabricated on a semiconductor substrate as integrated circuits wherein various layers of metals must be interconnected to one another to facilitate propagation of electronic signals within the device. An example of such a device is the use of magnetic multilayer films, or film stacks, as a storage element in memories, such as magneto-resistive random access memories (MRAM). The magnetic multi-layer films are typically a stack of different layers composed of various materials, for example permalloy (NiFe), cobalt iron (CoFe), tantalum (Ta), copper (Cu) and the like, and may also contain insulator materials such as aluminum oxide as a thin tunneling layer sandwiched between the multi-layers. The layers are typically deposited in overlying blanket films, layer by layer, and then featured. One of the typical processes used during feature fabrication is plasma etching, in which one or more layers comprising a film stack are removed, either partially or in total to form a feature.

During the plasma etching process, a metal film (or film stack) is etched using a plasma, for example a plasma comprising fluorine or chlorine chemistry. In such an example, the fluorine or chlorine from the etchant combines with the removed metal to form a residue. For example, if a film contains tantalum, a plasma etch process utilizing chlorine ($Cl_2$) will form tantalum chloride ($TaCl_5$) residue. Additionally, if a carbon-based photoresist is used during the metal etch, a metal-containing polymer may also form as an additional residue resulting from the etch process.

The residues formed typically deposit or redeposit along the sidewalls of the layer or film stack. These residues, for example, can be redeposition of the material just removed from the layer along the sidewalls of the film or film stack, or a by-product of the plasma etchant reacting with the removed metal and this by-product residue being deposited along the sidewalls of the film or film stack. Such residues may build up along the sides of the film or film stack above the upper surface of the film or film stack, forming a "veil" like structure.

Residues containing metal, metal chlorides, fluorides, oxides and polymers interfere with further processing of the film or film stack. These residues may contaminate any additional films or layers that are deposited upon the remaining metal and/or the film or film stack. Additionally, the residues, and especially the veil-like structures, can cause electrical short-circuits, for example as between the two magnetic layers separated by a thin tunneling layer within a MRAM device, and other problems, as well as causing film stack irreproducibility.

Therefore, there is a need in the art for a method of removing residues after plasma etching a magneto-resistive random access memory (MRAM) film stack.

SUMMARY OF THE INVENTION

The disadvantages of the prior art are overcome by a method for removal of residues after plasma etching a magneto-resistive random access memory (MRAM) film stack. The film stack contains a photoresist layer, an antireflective coating layer, a sacrificial layer, a conductive layer, a layer or layers of magnetic material and a tunneling layer. The sacrificial top layer, such as for example $SiO_2$, is used as a hard mask for etching a layer or layers of magnetic material to the tunneling layer, such as for example alumina. Following a chlorine-based or fluorine-based chemistry etching of the sacrificial top layer and conductive layer, a photoresist strip and an oxygen and chlorine-mixed chemistry etching for high selectivity to the tunneling layer, the residues, including the presence of any "veil"-like structures, as well as the sacrificial top layer, are removed using a buffered oxide etch (BOE) wet dip.

BRIEF DESCRIPTION OF THE DRAWINGS so that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method for removal of residues produced by plasma etching a magneto resistive random access memory (MRAM) film stack. The film stack contains a photoresist layer, an anti-reflective coating layer, a sacrificial layer, a conductive layer, a layer or layers of magnetic material and a tunneling layer. The sacrificial top layer, such as for example $SiO_2$, is used as a hard mask for etching a layer or layers of magnetic material to the tunneling layer, such as for example alumina. Following a chlorine-based or fluorine based chemistry etching of the sacrificial top layer and conductive layer, a photoresist strip and an oxygen and chlorine-mixed chemistry etching for high selectivity to the tunneling layer, the residues, including the presence of any "veil"-like structures, as well as the sacrificial top layer, are removed using a buffered oxide etch (BOE) wet dip.

Figure 1:
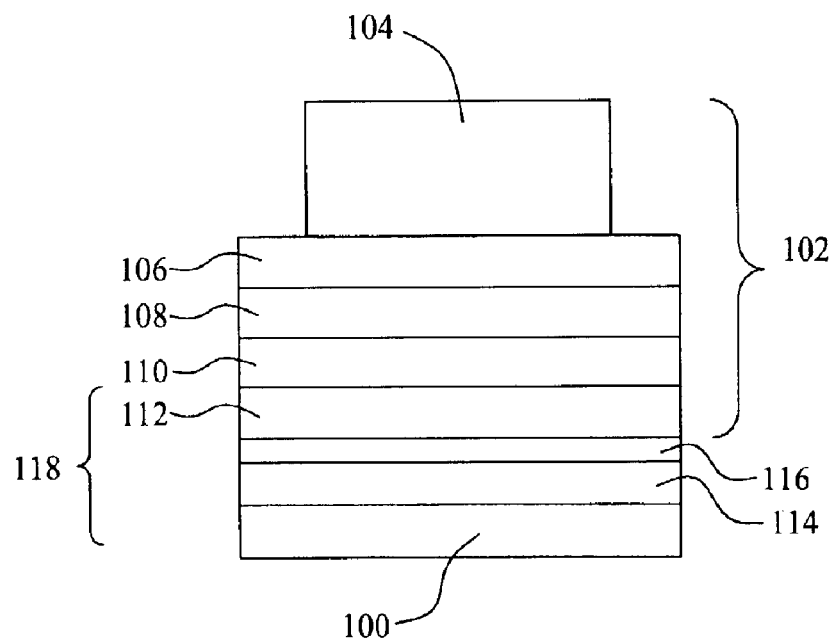
FIG. 1 depicts a schematic cross-sectional view of a substrate having a film stack.

FIG. 1 is a schematic cross-sectional view of a substrate 100 before the photoresist strip and plasma etching. In this example, the substrate 100 comprises a film stack 102. The film stack comprises a photoresist layer 104, an anti-reflective coating layer 106 (a bottom anti-reflective coating or BARC), sacrificial layer 108, conductive layer 110, magnetic layers 112, 114, separated by a thin tunneling layer 116, of which layers 112, 114 and 116 form a magnetic tunnel junction 118. The layer 104 is formed from a patterned photoresist material. The layer 106 is formed from an anti-reflective coating material, such materials are well known in the art. Together, layers 104 and 106 have a thickness of about 6000 Angstroms. The layer of photoresist material is conventionally processed using a lithographic pattern routine, i.e., the photoresist is applied to a surface of the wafer, exposed through a mask, and developed. The developed photoresist is generally a carbon-based polymer that remains only on top of the stack 102 in the areas that are to be protected during plasma etch. As the feature size of the lithographic pattern is reduced, inaccuracies in the pattern transfer process can arise from optical limitations inherent in the lithographic process, for example light reflection. The bottom anti-reflective coating layer 106 (or BARC) positioned between the underlying sacrificial layer 108 and the photoresist layer 104 controls the reflection of light from the underlying metal or metal-containing layers. The anti-reflective coating layer is typically composed various materials, including organic and inorganic materials, and may include, for example, inorganic materials such as silicon nitride, silicon oxynitride, titanium nitride, silicon carbide, and the like, and organic materials such as polyamides and polysulfones. The underlying sacrificial layer 108 is formed from, for example, silicon dioxide and boron or phosphorus doped or undoped silicon dioxide, and has a thickness of about 500 Angstroms. The conductive layer 110 is formed, for example, from either tantalum (Ta) or tantalum nitride (TaN) and has a thickness of about 300–600 Angstroms. The magnetic layers 112 and 114 are formed from, for example, magnetic materials such as nickel and cobalt iron alloys, such as CoFe, NiFe and the like, and each layer may consist of one or more sub-layers of a combination of these alloys. The magnetic layers 112 and 114 have a thickness of about 50–100 Angstroms for layer 112 and of about 300–400 Angstroms for layer 114. The thin tunneling layer 116 is composed of an insulating material, such as for example $Al_2O_3$ and has a thickness, for example, of about 10–15 Angstroms.

Figure 2:
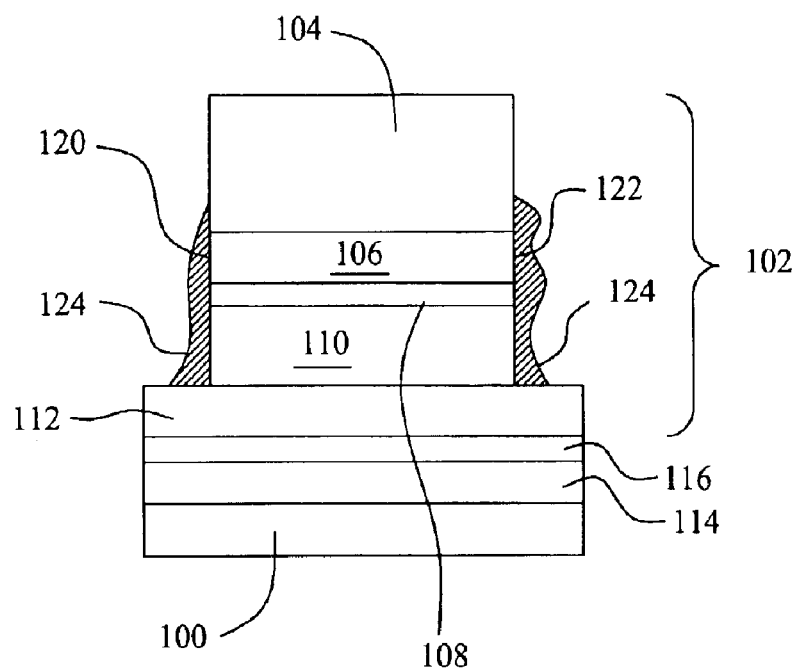
FIG. 2 depicts a schematic cross-sectional view of a film stack of FIG. 1 after a first plasma etching in accordance with one example of the inventive method.

FIG. 2 is a schematic cross-sectional view of the film stack 102 after plasma etching is completed. Either chlorine-based or fluorine-based conventional chemistries, such as for example $CF_4$ or $CHF_3$, can be used during plasma etching of metals such as tantalum or tantalum nitride. Plasma etching can be performed in a Decoupled Plasma source (DPS) II module of the Centura® metal etch system, available from Applied Materials, Inc. of Santa Clara, Calif. The DPS II module uses a 2 MHz inductive plasma source to generate and sustain high density plasma. A wafer is biased by a 13.56 MHz bias source. The decoupled nature of the plasma source allows independent control of ion energy and ion density. The DPS II module provides a wide process window over changes in source and bias power, pressure, and etch gas chemistry and uses an endpoint system to determine an end of the etch process.

During a first plasma etching of the film stack 102 that contains a metallic layer, some amount of the metal (e.g., tantalum) from the layer 110 is etched from the stack and becomes deposited on the top and sidewalls of the photoresist layer 104. The anti-reflective coating layer 106 and the sacrificial layer 108 not covered by the photoresist layer 104 are also etched and materials from these layers may also become deposited on the top and sidewalls of the photoresist layer 104. The photoresist layer 104 may also be partially dissolved by the etchant. During the etch process, the etched metal combines with the components of the etchant (for example, chlorine or fluorine) as well as with components of the photoresist and may also combine with the etched components of the anti-reflective coating layer 106 and sacrificial layer 108. A first residue 124 containing, for example, metal, metallic-chloride or metallic-fluoride as well as metal-containing polymers, as well as other possible combinations from the etched anti-reflective coating and sacrificial layer components, is deposited on the sidewalls 120 and 122 of the film stack 102 or elsewhere on the substrate. As a result of this residue generation, after a first plasma etching, first residue 124 remains on the sidewalls 120 and 122. The first residue is considered a contaminant with respect to further processing of the substrate.

Figure 3:
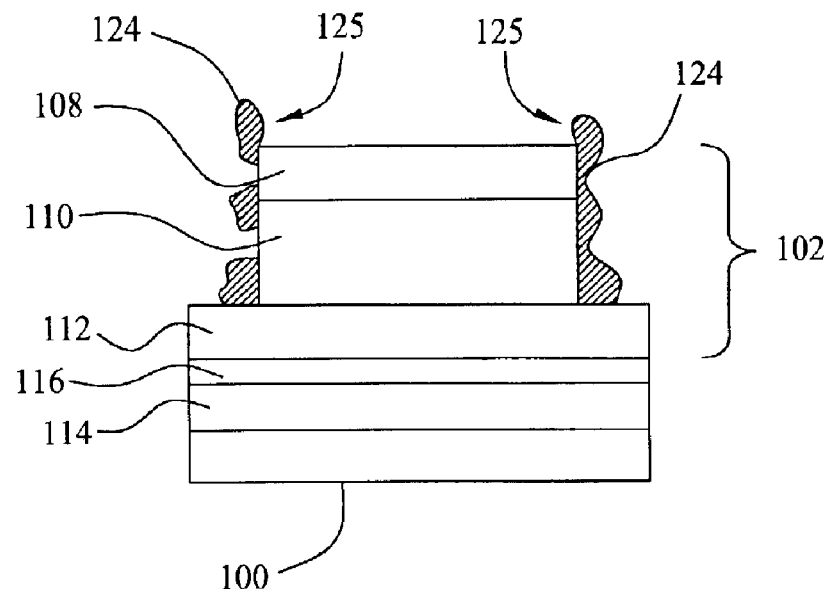
FIG. 3 depicts a schematic cross-sectional view of a film stack of FIG. 2 after photoresist removal stripping in accordance with one example of the inventive method.

The photoresist material in layer 104 and anti-reflective coating material in layer 106 are then removed by conventional photoresist stripping techniques, such as, for example, plasma stripping and passivation processes or wet chemical etching. FIG. 3 depicts a schematic cross-sectional view of the film stack 102 after photoresist stripping of photoresist layer 104 and anti-reflective coating layer 106. After removal of the photoresist layer 104 and anti-reflective coating layer 106, the first residue 124 remains not only on the sidewalls 120 and 122, but also remains and extends above the surface of the now top-most layer, the sacrificial mask layer 108, to form a veil 125.

Figure 4:
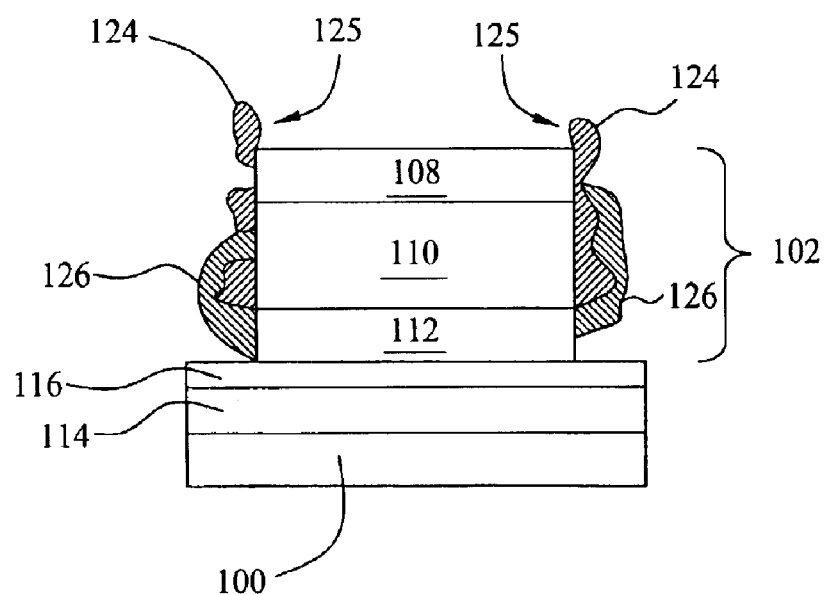
FIG. 4 depicts a schematic cross-sectional view of a film stack of FIG. 3 after a second plasma etching in accordance with one example of the inventive method.

FIG. 4 is a schematic cross-sectional view of the film stack 102 after a oxygen and chlorine-mixed chemistry plasma etch, i.e. a second plasma etch, is completed in accordance with one example of the present invention. Either oxygen-based or chlorine-based chemistries, such as for example oxygen and/or chlorine plasma, may be utilized during etching of the magnetic layer 112 down to the etch stop of the thin tunneling layer 116. The sacrificial mask layer 108 forms a hard mask that protects the underlying layers of the film stack 102, thus permitting high selectivity and etching of the second plasma etch to the thin tunneling layer.

During the oxygen and chlorine-mixed chemistry etch of the film stack as depicted in FIG. 4, the sacrificial layer 108 and the conductive layer 110 are not etched and act together as a hard mask over the underlying layers 112, 114 and 116. The magnetic layer 112 not covered by the sacrificial mask of layer 108 and the conductive layer 110 is etched and some of the material from layer 112 may become deposited on top of the sacrificial layer 108. During the etch process, the etched metal combines with the components of the etchant to form a second residue 126, containing for example, metallic-oxide or metallic-chloride, which is deposited on the sidewalls 120 and 122 or elsewhere on the substrate and/or added to the first residue 124 already deposited on the sidewalls 120 and 122 or elsewhere on the substrate. The residue is considered a contaminant with respect to further processing of the substrate.

Figure 5:
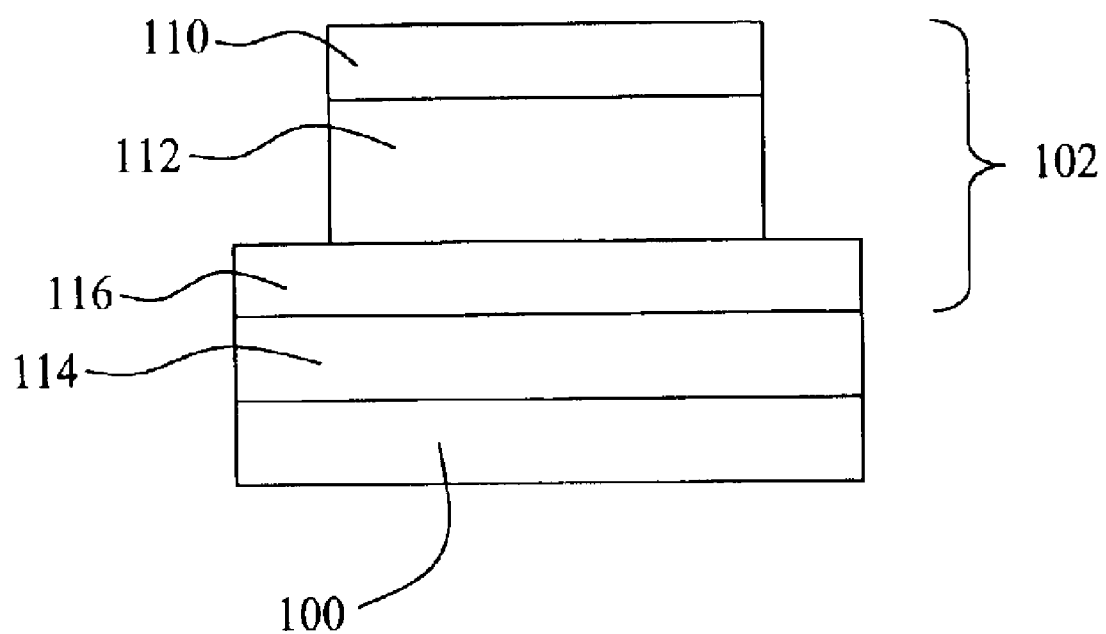
FIG. 5 depicts a schematic cross-sectional view of a film stack of FIG. 4 after use of one example of the inventive method for removal of residues from a film stack.

The sacrificial layer 108 and residues 124 and 126 are removed by post-plasma-etch processing the substrate in a buffered oxide etch (BOE) wet dip solution. FIG. 5 depicts a schematic cross-sectional view of the film stack 102 after the buffered oxide etch wet dip in accordance with one example of the present invention.

Figure 6:
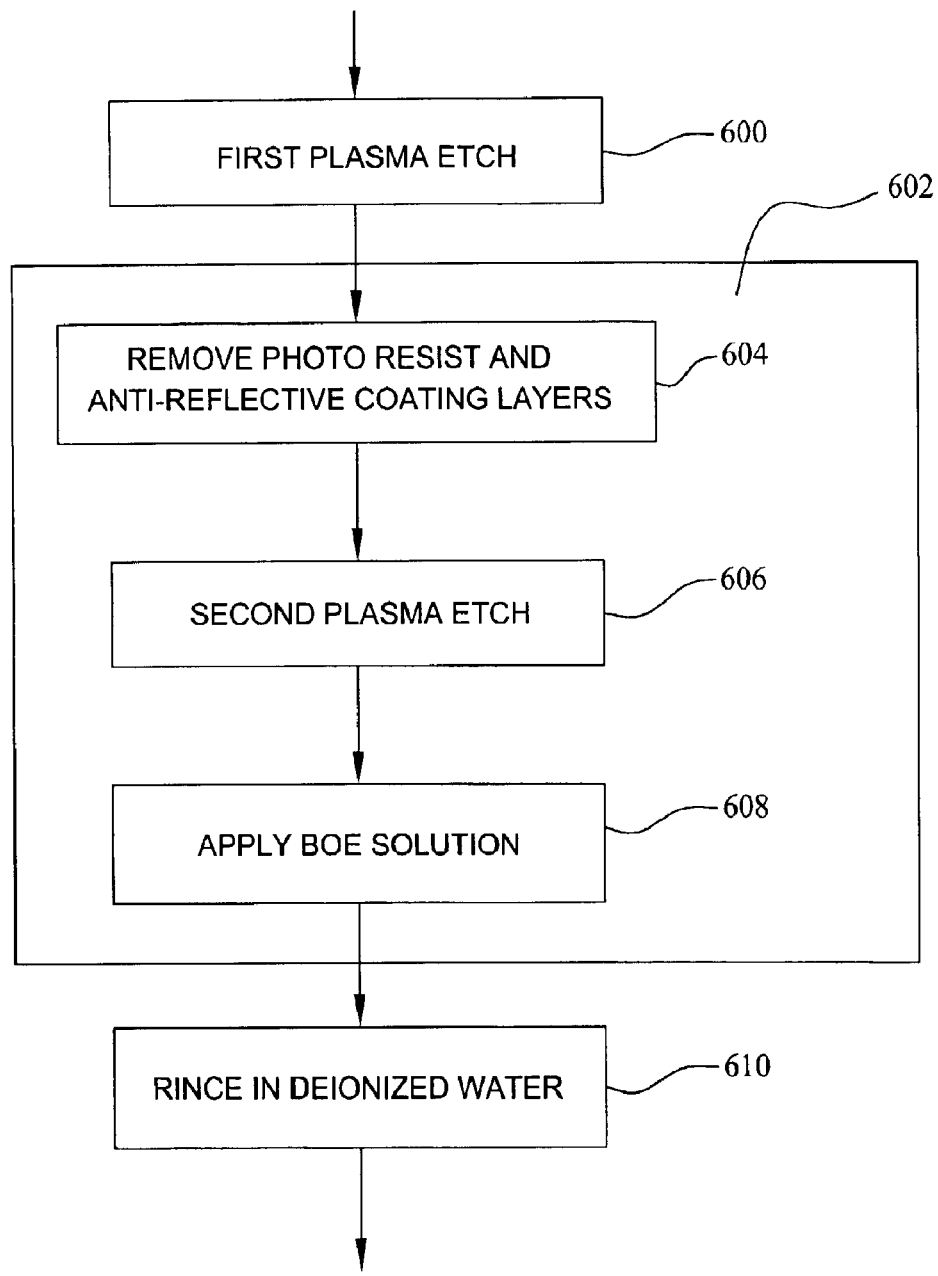
FIG. 6 depicts a flow diagram of an example of the inventive method.

FIG. 6 is a flow diagram of an example of the inventive method 602 for post-plasma-etch processing the substrate to remove residues and the sacrificial layer from the substrate. At step 600, a film stack that comprises a layer or layers of metals undergoes a first plasma etching. During step 600, a first residue forms on the side walls of the film stack or elsewhere on the substrate. In one embodiment of the first plasma etch of step 600, the wafer temperature was between about 15 to about 80 degrees Celsius, pressure and flow of the reactant gases $CF_4$ and $CHF_3$ were between about 5 mTorr to about 40 mTorr and between about 40–80 sccm and 10–20 sccm, respectively, and plasma excitation power was about 250–2500 W. Argon is used as a diluent at a flow rate of about 40–80 sccm. The cathode pedestal bias power was between about 0–300 W.

In one specific embodiment of the first plasma etch of step 600, the wafer temperature was about 40 degrees Celsius, pressure and flow of the reactant gases $CF_4$ and $CHF_3$ were about 10 mTorr and 60 sccm and 20 sccm, respectively, and plasma excitation power was about 1000 W. Argon is used as a diluent at a flow rate or about 60 sccm. The cathode pedestal bias power was about 50 W.

After step 600, the photoresist and underling anti-reflective coating layer are removed by step 604, leaving a sacrificial layer as the top layer of the film stack, with the first residue remaining on the sidewalls of the film stack and above the surface of the sacrificial layer, forming a veil. The plasma stripping of the photoresist and anti-reflective coating layers of step 604 is a process generally performed using a downstream, oxygen plasma reactor. The process can be performed in the Advanced Strip and Passivation (ASP) module of the Centura® metal etch system, available from Applied Materials, Inc. of Santa Clara, Calif. The ASP module is a microwave downstream oxygen plasma reactor in which the plasma is confined to a plasma tube and only reactive neutrals are allowed to enter a process chamber. Such a plasma confinement scheme precludes plasma-related damage of the substrate or circuits formed on the substrate. In the ASP module, wafer backside is heated radiantly by quartz halogen lamps and the wafer temperature can be maintained between about 200 to about 300 degrees Celsius.

The photoresist stripping can also be performed in-situ in the DPS II chamber. In that case, duration of the plasma stripping is generally between 1 and 8 minutes. In one embodiment, after the first plasma etching of the film stack 102, the wafer temperature was between about 15 to about 80 degrees Celsius, pressure and flow of a reactant gas (e.g., oxygen) were between about 5 to about 40 mTorr and between about 50 to about 500 sccm, respectively, plasma excitation power was about 250–2500 W, and duration of the process was about 1–3 minutes. Nitrogen was also supplied to the reactor at a flow rate of about 0–100 sccm and the cathode pedestal was biased with about 0–100 W.

In one specific embodiment, after the first plasma etching of the film stack 102, the wafer temperature was about 40 degrees Celsius, pressure and flow of a reactant gas (e.g., oxygen) were about 32 mTorr and 100 sccm, respectively, plasma excitation power was about 1000 W, and duration of the process was about 2 minutes. Nitrogen was also supplied to the reactor at a flow rate of about 10 sccm and the cathode pedestal was biased with about 10 W.

Following step 604, the film stack undergoes step 606, a second plasma etching using oxygen and chlorine-mixed chemistries. During step 606, a second residue forms on the side walls of the film stack or elsewhere on the substrate. In one embodiment of the second plasma etch of step 606, which utilizes oxygen and chlorine-mixed chemistry, the wafer temperature was between about 15 to about 80 degrees Celsius, pressure and flow of the reactant gases Cl2 and O2 were about 5–40 mTorr and between about 20–100 sccm and between about 10–50 sccm, respectively, and plasma excitation power was about 250–2500 W. Additionally, argon is supplied to the reactor at a flow rate of about 20 sccm and the cathode pedestal was biased with about 50–300 W.

In one specific embodiment of the second plasma etch of step 606, which utilizes oxygen and chlorine-mixed chemistry, the wafer temperature was about 40 degrees Celsius, pressure and flow of the reactant gases Cl2 and O2 were about 5 mTorr and 40 sccm and 20 sccm, respectively, and plasma excitation power was about 700 W. Additionally, argon is supplied to the reactor at a flow rate of 20 sccm and the cathode pedestal was biased with 100 W.

At step 608, a buffered oxide etch (BOE) solution using a buffered oxide etchant is performed to remove the residues in accordance with one embodiment of the invention. During step 608, the sacrificial layer is also removed by the buffered oxide etch. At step 610, a deionized (DI) water rinse is performed to remove any remaining traces of residues, sacrificial layer and the buffered oxide etchant.

In one embodiment, the buffered oxide etch solution of step 608 comprises hydrogen fluoride, ammonium fluoride and deionized water. In particular, the ratio of the ammonium fluoride to hydrogen fluoride in the buffered oxide etch ranges from about 6 to 1 to about 15 to 1 by volume. Duration of the buffered oxide etch treatment step is generally between about 10 and 20 seconds, though longer exposures of up to about 2 minutes are not foreclosed by this invention. When used to dissolve the etch residues, the buffered oxide etch solution has a temperature of about 10 to 30 degrees Celsius.

In one embodiment, a film stack containing tantalum with silicon dioxide as the sacrificial layer is etched in a first plasma chemistry comprising in active part $CF_4/CHF_3$, followed by a photoresist removal step applied to the substrate. Thereafter, a second etch is applied to the film stack via a plasma chemistry comprising in active part $O_2/Cl_2$. Lastly, the film stack and substrate was cleaned and the residues thereon removed by using a buffered oxide etch at a 6:1 ratio by volume at a temperature of about 20 degrees Celsius for a duration of about 10 seconds.

Although the foregoing discussion referred to a film stack comprising metal, the buffered oxide etch step can also be used after plasma etching of a film stack comprising no metallic layers to remove any residues.

Figure 7:
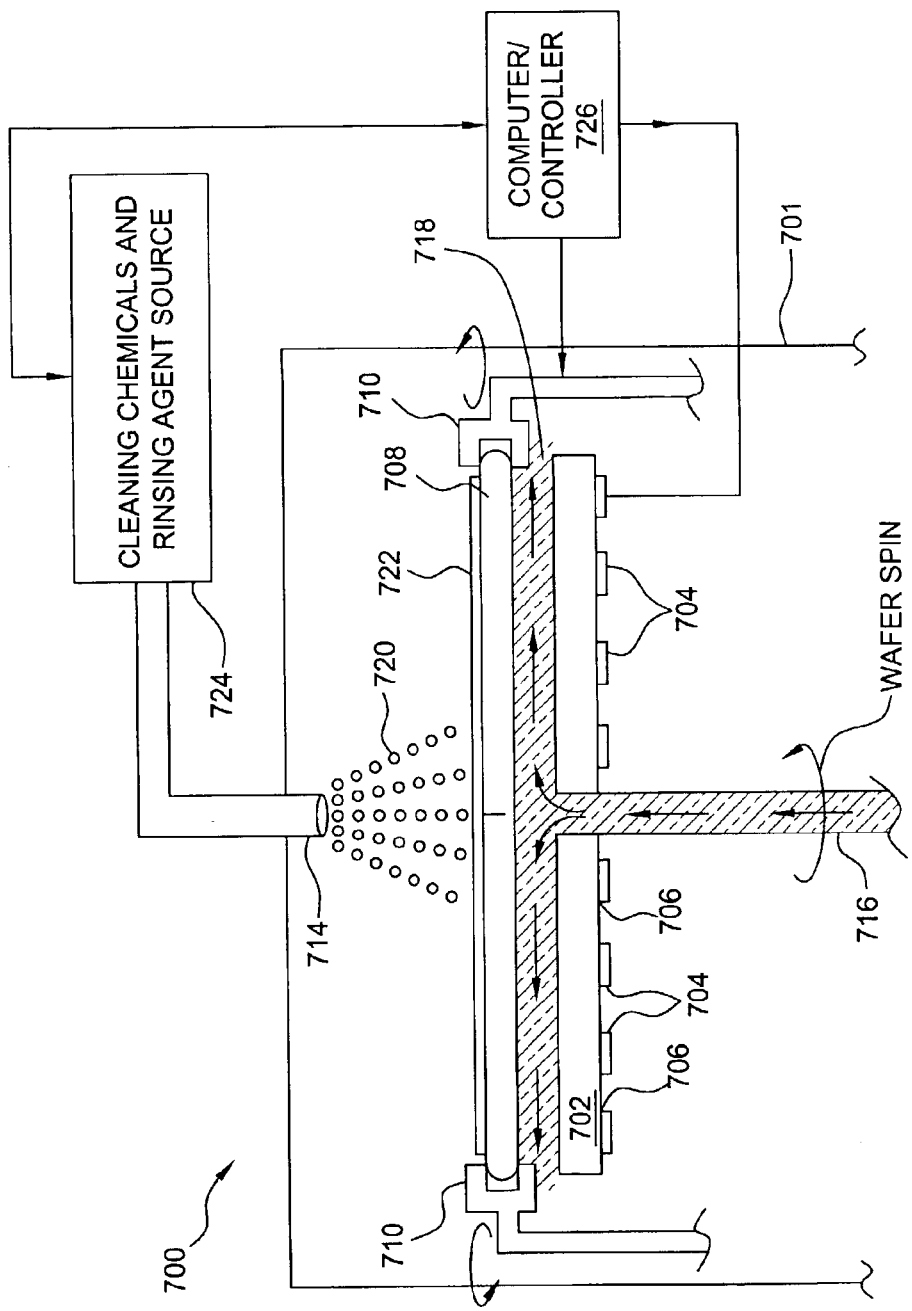
FIG. 7 depicts a schematic, cross sectional view of an illustrative wet dip cleaning module.

One illustrative embodiment of an apparatus that can be used for cleaning and rinsing a substrate in accordance with the present invention is a single substrate wet cleaning module. FIG. 7 depicts a simplified cross-sectional view of an illustrative embodiment of a single substrate wet cleaning module 700. The module 700 is described in detail in U.S. patent application Ser. No. 09/945,454, filed Aug. 31, 2001 (attorney docket number 4936), which is herein incorporated by reference.

The module 700 applies cleaning chemicals and/or rinsing agents to the top and bottom of a substrate. To enhance the cleaning process, the module 700 uses acoustic or sonic waves to agitate the cleaning chemicals and/or rinsing agents.

The module 700 comprises a chamber 701, a nozzle 714, and a substrate support 712. The substrate support is mounted within the chamber 701 and comprises edge claps 710, plate 702 and a plurality of acoustic or sonic transducers 704. The plate 702 has a shape that is substantially the same as a substrate and supports the plurality of acoustic or sonic transducers 704. The plate 702 is, for example, made of aluminum, but can be formed of other materials such as, but not limited to, stainless steel and sapphire. The plate 702 is coated with a corrosion resistant fluoropolymer such as HALAR or PFA. The transducers 704 are attached to the bottom of the plate 702 using an adhesive, for example, an epoxy 706. In one embodiment of the cleaning module 700, the transducers 704 are arranged in an array that covers substantially the entire bottom surface of plate 702, e.g., approximately 80% of plate 702. The transducers generate sonic waves in the frequency range between 400 kHz and 8 MHz. In one embodiment of the module 700, the transducers are piezoelectric devices.

The plurality of edge clamps 710 retain the substrate 708 face up above the plate 708 to form a gap 718 between the backside of the wafer and the top surface of the plate 702. The gap 718 is approximately 3 mm. Cleaning chemicals and/or rinsing agents are provides to the gap via channel 716. The clamps are rotated to cause the substrate 708 to rotate about its central axis at a rate between 0 and 6000 rpm. In this embodiment of module 700, the substrate 708 and clamps 710 rotate, while the plate 702 is stationary.

The nozzle 714 sprays cleaning chemicals and/or rinsing agents upon the top of the substrate 708 (i.e., the surface of the substrate comprising features, transistors, or other circuitry). As the nozzle 714 sprays the top of the substrate 708, the same or different cleaning chemicals and/or rinsing agents are supplied to the gap 718 via channel 716 as the substrate is rotated such that the cleaning chemicals and/or rinsing agents flow across the top and bottom surfaces of the substrate.

The nozzle 714 and channel 716 are coupled to a source 724 of cleaning chemicals and/or rinsing agents. The source 724 may be the same for the nozzle 714 and channel 716, or a separate source may be couple to each of the nozzle 714 and channel 716. In the present embodiment of the invention, the module 700 is used to clean the substrate 708 using a solution of buffered oxide etch solution, e.g., hydrogen fluoride, ammonium fluoride, and deionized water. The module 700 is further used to rinse the substrate in deionized water.

A computer controller 726 is generally used to control the operation of the module 700. Specifically, the computer controller 726 controls the rotation of the substrate support 712, the activation of the transducers 704, the supply of cleaning chemicals and/or rinsing agents, and so on.

Figure 8:
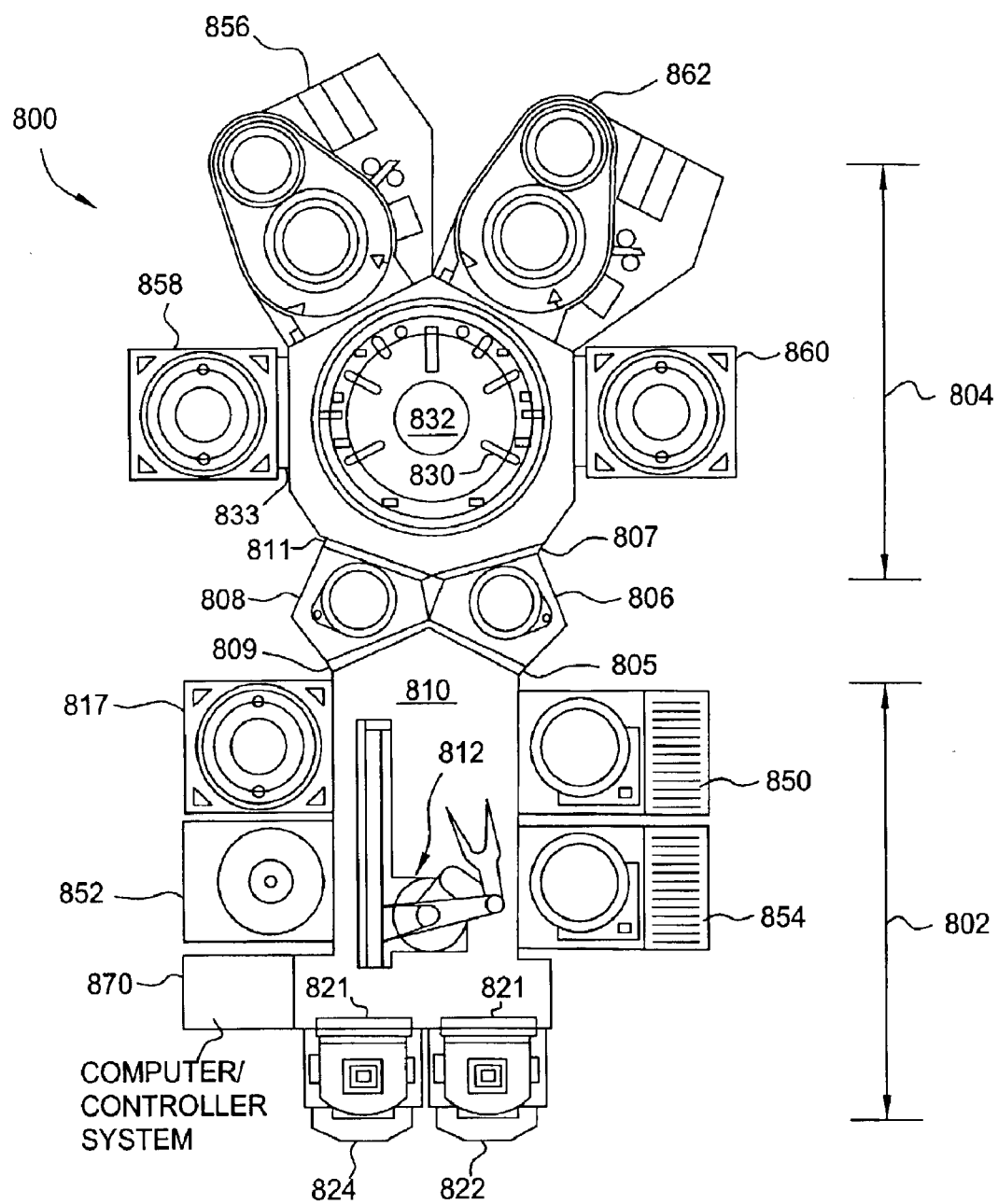
FIG. 8 depicts a schematic view of an illustrative platform for performing the method of the invention.

The method of the present invention (FIG. 6) is illustratively performed on an integrated processing platform 800 shown in FIG. 8 that comprises apparatus for performing both atmospheric and sub-atmospheric processing. The platform 800 and the various modules and tools that can be used with such a platform are described in detail in U.S. patent application Ser. No. 09/945,454, filed Aug. 31, 2001 (attorney docket number 4936), which is herein incorporated by reference.

Depending upon the process modules that are used in the platform 800, the platform 800 (also referred to as a process tool) can be used to perform etching, substrate cleaning, photoresist stripping, substrate inspection and the like. The platform 800 comprises an atmospheric platform 802 and a sub-atmospheric platform 804. The sub-atmospheric platform 804 and the atmospheric platform 802 may be coupled together by a single substrate load lock 806 or, as shown in the depicted example, are coupled together by a pair of single load locks 806 and 808. In some applications, the sub-atmospheric and atmospheric platforms 804 and 802 are not coupled together and may be used separately. One such stand-alone platform configuration may contain photoresist stripping modules and wet cleaning modules from providing a platform that performs post-etch processing.

The atmospheric platform 802 comprises a central atmospheric transfer chamber 810 containing a substrate handling device 812, such as a robot. Directly attached to the atmospheric transfer chamber 810 is a substrate wet cleaning module 850, an integrated particle monitor 852 and a critical dimension (CD) measuring tool 854. A strip or dry clean module 817 can also be attached to the atmospheric transfer chamber 810, if desired. Each module or tool is coupled to the transfer chamber 810 by a separately closable and sealable opening, such as a slit valve. The transfer chamber is maintained at substantially atmospheric pressure during operation. The substrate handling device 812 is able to transfer substrates from one module or tool to another module or tool that is attached to the atmospheric transfer chamber 810. In the embodiment shown, the substrate handling device 812 is a dual blade, single arm, single wrist robot. Other types of robots may be used to access the various modules and tools.

The atmospheric transfer chamber 810 is coupled to at least one substrate input/output module 820 that provides and receives substrates to and from the platform 800. In one embodiment of the platform 800, the module 820 comprises at least one front opening unified pod (FOUP). Two FOUPs 822 and 824 are depicted. The substrate handling device 812 accesses each FOUP through a sealable access door 821. The substrate handling device 812 moves linearly along a track 823 to facilitate access to all of the modules and tools.

The atmospheric transfer chamber 810 is coupled to the pair of load locks 806 and 808 through sealable doors 805 and 809 such that the substrate handling device 812 can access the load locks 806 and 808. The sub-atmospheric platform 804 comprises a central sub-atmospheric transfer chamber 830 and a plurality of process chambers 856, 858, 860, and 862. Sealable doors 807 and 811 respectively couple each load lock 806 and 808 to the sub-atmospheric transfer chamber 830. The sub-atmospheric transfer chamber 830 contains a substrate handing device 832, such as a robot, that accesses the load locks 806 and 808 as well as the process chambers 856, 858, 860 and 862. The process chambers 856, 858, 860 and 862 are each coupled to the sub-atmospheric transfer chamber 830 via separately closable and sealable openings, such as slit-valves. The process chambers 856, 858, 860 and 862 may comprise one or more etching chambers such as the DPS or DPS II chamber that are available from Applied Materials, Inc. of Santa Clara, Calif. Additionally, one or more photoresist stripping chambers such as the ASP chamber described above may be used as one or more of the process chambers 856, 858, 860 and 862. As also described above, the ASP chamber, if used, may be located either on the sub-atmospheric platform 804 or the atmospheric platform 802. FIG. 8 shows the sub-atmospheric platform 804 comprising two etch chambers 858 and 860 and two photoresist stripping chambers 856 and 862. The sub-atmospheric platform 804 is, for example, a CENTURA platform available for Applied Materials, Inc. of Santa Clara, Calif.

The platform 800 also includes a system computer 870 that is coupled to and controls each module that is coupled to the atmospheric and sub-atmospheric platforms 802 and 804, controls the substrate handling devices 812 and 832, and controls the load locks 806 and 808. Generally, the system computer 870 controls all aspects of operation of the platform 800 either by direct control of the sub-systems, modules, tools and apparatus or by controlling the computers associated with those sub-systems, modules, tools and apparatus. The system computer 870 enables feedback from one module or tool to be used to control the flow of substrates through the platform 800 and/or control the processes or operation of the various modules and tools to optimize substrate throughput.

The invention may be practiced in other semiconductor structures and devices wherein the processing parameters may be adjusted to achieve acceptable characteristics by those skilled in the art by utilizing the teachings disclosed herein without departing from the spirit of the invention. While the foregoing is directed to the preferred embodiment of the present invention, other and further embodiments of the invention may be devised without departing from the basic scope thereof, and the scope thereof is determined by the claims that follow.

What is claimed is:

1. A method for removal of residues after plasma etching of a substrate comprising a film stack containing a patterned photoresist material layer, an anti-reflective coating layer, a sacrificial layer, a conductive layer, and a magnetic layer, the method comprising:
    a first plasma etching of the anti-reflective coating, conductive and sacrificial layers of the substrate;
    stripping the photoresist material layer and the anti-reflective coating layer from the substrate;
    a second plasma etching of the magnetic layer of the substrate; and
    treatment of the substrate in a buffered oxide etch wet dip solution to remove residue formed during the first and second plasma etching steps and to remove the sacrificial layer, wherein the buffered oxide wet dip solution is comprised of hydrogen fluoride and ammonium fluoride.

2. The method of claim 1, wherein the sacrificial layer comprises silicon dioxide.

3. The method of claim 1, wherein the residues comprise a metal.

4. The method of claim 1, wherein the residues comprise at least one of tantalum, cobalt, nickel, or iron.

5. The method of claim 1 wherein the film stack further comprises a tunneling layer beneath the magnetic layer and wherein the sacrificial layer forms a hard mask for etching the film stack to the tunneling layer.

6. The method of claim 5, wherein the tunneling layer is comprised of an insulating material.

7. The method of claim 6, wherein the tunneling layer comprises alumina.

8. The method of claim 5, wherein the sacrificial layer comprises silicon dioxide.

9. The method of claim 1, wherein the residues comprise at least one of tantalum, cobalt, nickel, or iron.

10. The method of claim 1, wherein the ratio of ammonium fluoride to hydrogen fluoride is between about 6 to 1 to 15:1 by volume.

11. The method of claim 1, wherein a duration of the buffered oxide treatment of the substrate is between about 10 seconds to about 2 minutes.

12. The method of claim 1, wherein a duration of the buffered oxide treatment of the substrate is between about 10 seconds to about 20 seconds.

13. The method of claim 1, wherein a temperature of the buffered oxide etch wet dip solution is between about 10 to about 30 degrees Celsius.

14. The method of claim 1, wherein a temperature of the buffered oxide etch wet dip solution is about 20 degrees Celsius.

15. A method for removal of residues after plasma etching of a substrate comprising a film stack containing a patterned photoresist material layer, an anti-reflective coating layer, a sacrificial layer, a conductive layer, and a magnetic layer, the method comprising:
    a first plasma etching of the anti-reflective coating, conductive and sacrificial layers of the substrate;
    stripping the photoresist material layer and the anti-reflective coating layer from the substrate;
    a second plasma etching of the magnetic layer of the substrate; and treatment of the substrate in a buffered oxide etch wet dip solution to remove residue formed during the first and second plasma etching steps and to remove the sacrificial layer, wherein the buffered oxide etch wet dip solution comprises hydrogen fluoride, ammonium fluoride and deionized water.

16. The method of claim 15, wherein the ratio of ammonium fluoride to hydrogen fluoride is between about 6 to 15:1 by volume.

17. The method of claim 15, wherein a duration of the buffered oxide treatment of the substrate is between about 10 seconds to about 2 minutes.

18. The method of claim 15, wherein a duration of the buffered oxide treatment of the substrate is between about 10 seconds to about 20 seconds.

19. The method of claim 15, wherein a temperature of the buffered oxide etch wet dip solution is between about 10 to about 30 degrees Celsius.

20. The method of claim 15, wherein a temperature of the buffered oxide etch wet dip solution is about 20 degrees Celsius.

21. The method of claim 15, wherein the sacrificial layer comprises silicon dioxide.

22. The method of claim 15, wherein the residues comprise a metal.

23. The method of claim 15 wherein the film stack further comprises a tunneling layer beneath the magnetic layer and wherein the sacrificial layer forms a hard mask for etching the film stack to the tunneling layer.

24. The method of claim 23, wherein the tunneling layer is comprised of an insulating material.

25. The method of claim 24, wherein the tunneling layer comprises alumina.

26. The method of claim 23, wherein the sacrificial layer comprises silicon dioxide.

* * * * *

UNITED STATES PATENT AND TRADEMARK OFFICE
CERTIFICATE OF CORRECTION

PATENT NO. : 6,984,585 B2
DATED : January 10, 2006
INVENTOR(S) : Ying et al.

It is certified that error appears in the above-identified patent and that said Letters Patent is hereby corrected as shown below:

<u>Title page,</u>
Item [73], Assignee, insert -- Applied Materials, Inc. Santa Clara, CA, (US). --.

<u>Column 10,</u>
Line 32, after "6 to" insert -- 1 to --.

Signed and Sealed this

Eleventh Day of April, 2006

JON W. DUDAS
*Director of the United States Patent and Trademark Office*